(12) United States Patent
Park et al.

(10) Patent No.: US 8,458,576 B2
(45) Date of Patent: Jun. 4, 2013

(54) TRANSPORT STREAM GENERATING APPARATUS, TURBO PACKET DEMULTIPLEXING APPARATUS, AND METHODS THEREOF

(75) Inventors: Eui-jun Park, Seoul (KR); Yong-sik Kwon, Seoul (KR); Jong-hun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1044 days.

(21) Appl. No.: 12/100,572

(22) Filed: Apr. 10, 2008

(65) Prior Publication Data

US 2008/0256412 A1    Oct. 16, 2008

Related U.S. Application Data

(60) Provisional application No. 60/911,165, filed on Apr. 11, 2007.

(30) Foreign Application Priority Data

Nov. 26, 2007 (KR) .................. 10-2007-0120783

(51) Int. Cl.
*G06F 11/00* (2006.01)
(52) U.S. Cl.
USPC ........................................................ 714/784
(58) Field of Classification Search
USPC ........................................................ 714/784
See application file for complete search history.

(56) References Cited

U.S. PATENT DOCUMENTS

| | | | | |
|---|---|---|---|---|
| 6,298,461 B1 * | 10/2001 | Tong et al. | ..................... | 714/755 |
| 6,865,699 B2 | 3/2005 | Tanaka et al. | | |
| 6,910,170 B2 | 6/2005 | Choi et al. | | |
| 7,148,932 B2 | 12/2006 | Choi et al. | | |
| 7,281,197 B2 * | 10/2007 | Li | ................. | 714/790 |
| 7,519,898 B2 * | 4/2009 | Narayanan et al. | ........... | 714/801 |
| 7,617,435 B2 * | 11/2009 | Zhang | ........................ | 714/756 |
| 7,802,165 B2 * | 9/2010 | Jain et al. | ..................... | 714/755 |
| 7,925,963 B2 * | 4/2011 | Eroz et al. | ..................... | 714/790 |
| 2007/0268979 A1 | 11/2007 | Chang et al. | | |

FOREIGN PATENT DOCUMENTS

| | | |
|---|---|---|
| KR | 2002-59529 | 7/2002 |
| KR | 2006-47771 | 5/2006 |

OTHER PUBLICATIONS

International Search Report and Written Opinion issued in corresponding International Patent Application No. PCT/KR2008/002043 issued Aug. 21, 2008.

* cited by examiner

*Primary Examiner* — Bryce Bonzo
(74) *Attorney, Agent, or Firm* — Sughrue Mion, PLLC

(57) ABSTRACT

A transport stream generating apparatus, a turbo packet demultiplexing apparatus, and methods thereof, the transport stream generating apparatus including: a Reed Solomon (RS) encoder to RS-encode turbo data, an interleaver to interleave the RS-encoded turbo data, a duplicator to add a parity insertion area to the interleaved turbo data, and a multiplexer to multiplex normal data and the turbo data processed by the duplicator to generate a transport stream. Accordingly, reception performance can be improved in an advanced vestigial sideband (AVSB) system.

32 Claims, 6 Drawing Sheets

TRANSPORT STREAM GENERATING APPARATUS, TURBO PACKET DEMULTIPLEXING APPARATUS, AND METHODS THEREOF

CROSS-REFERENCE TO RELATED APPLICATIONS

This application claims priority from U.S. Provisional Patent Application No. 60/911,165, filed on Apr. 11, 2007 in the United States Patent and Trademark Office, and from Korean Patent Application No. 10-2007-0120783, filed on Nov. 26, 2007 in the Korean Intellectual Property Office, the disclosures of which are incorporated herein by reference.

BACKGROUND OF THE INVENTION

1. Field of the Invention

Aspects of the present invention relate to a transport stream generating apparatus, a turbo packet demultiplexing apparatus, and methods thereof, and, more particularly, to a transport stream generating apparatus and a turbo packet demultiplexing apparatus that include an interleaver of a large size suitable for an advanced vestigial sideband (AVSB) system, and methods thereof.

2. Description of the Related Art

With recent development in electronics and communications technologies, a broadcasting system field introducing a digital technology and various published standards for digital broadcasting has become prevalent. More specifically, the Advanced Television Systems Committee (ATSC) vestigial sideband (VSB) standard is used in the U.S. and the Digital Video Broadcasting-Terrestrial (DVB-T) standard is used in Europe.

The ATSC VSB transmission system is based on a National Television System Committee (NTSC) frequency band, facilitates communications between a transmitter and a receiver, and is economically efficient. The ATSC VSB transmission system uses a single carrier amplitude modulation VSB and can ensure transmission of high quality video, audio, and auxiliary data with a single 6 MHz bandwidth.

FIG. 1 is a block diagram illustrating a conventional digital broadcasting system according to the ATSC VSB standard. Referring to FIG. 1, a conventional digital broadcasting system includes a dual transport stream generating apparatus 10, a transmitting apparatus 20, and a receiving apparatus 30.

The dual transport stream generating apparatus 10 receives normal data and turbo data from an outside source, and multiplexes the normal data and the turbo data to generate a dual transport stream. The dual transport stream generating apparatus 10 includes an RS encoder 12, a duplicator 14, and a multiplexer 16. The RS encoder 12 performs Reed-Solomon (RS) encoding with respect to the turbo data. The duplicator 14 prepares a parity insertion area in the RS-encoded turbo data. The multiplexer 16 multiplexes the turbo data having the parity insertion area and the normal data to generate the dual transport stream.

The transmitting apparatus 20 receives the dual transport stream from the dual transport stream generating apparatus 10 and up-converts the dual transport stream through processes such as randomizing, RS encoding, interleaving, and modulating. The receiving apparatus 30 down-converts the dual transport stream and recovers an original signal through processes such as demodulating, equalizing, derandomizing, RS decoding, and deinterleaving.

As described above, the conventional digital broadcasting system generally includes the dual transport stream generating apparatus 10, the transmitting apparatus 20, and the receiving apparatus 30, and the dual transport stream generating apparatus 10 generally includes the RS encoder 12, the duplicator 14, and the multiplexer 16. However, in the conventional digital broadcasting system having the above structure, if fading occurs in a mobile channel environment, a good signal reception cannot be obtained, and reception performance deteriorates as a result.

SUMMARY OF THE INVENTION

Aspects of the present invention provide a transport stream generating apparatus and a turbo packet demultiplexing apparatus that include an interleaver of a large size suitable for an advanced vestigial sideband (AVSB) system, and methods thereof.

According to an aspect of the present invention, there is provided a transport stream generating apparatus for a digital broadcasting system, the transport stream generating apparatus including: a Reed Solomon (RS) encoder to RS-encode turbo data; an interleaver to interleave the RS-encoded turbo data; a duplicator to add a parity insertion area to the interleaved turbo data; and a multiplexer to multiplex normal data and the turbo data processed by the duplicator to generate a transport stream.

According to another aspect of the present invention, the interleaver may adjust a memory size thereof according to a data transmission rate.

According to another aspect of the present invention, the interleaver may be a convolutional interleaver.

According to another aspect of the present invention, the interleaver may set a number of branches thereof and a memory size thereof to satisfy:

$$B*(B-1)*M=N*\text{a packet length},$$

where B is the number of branches, M is the memory size, and N is an integer.

According to another aspect of the present invention, there is provided a method of generating a transport stream in a digital broadcasting system, the method including: RS-encoding turbo data; interleaving the RS-encoded turbo data; adding a parity insertion area to the interleaved turbo data; and multiplexing normal data and the turbo data that has the parity insertion area added thereto to generate a transport stream.

According to another aspect of the present invention, the interleaving may adjust a memory size of an interleaver performing the interleaving according to a data transmission rate.

According to another aspect of the present invention, the interleaving may use a convolutional interleaver.

According to another aspect of the present invention, the interleaving may set a number of branches of the interleaver and a memory size of the interleaver to satisfy:

$$B*(B-1)*M=N*\text{a packet length},$$

where B is the number of branches, M is the memory size, and N is an integer.

According to another aspect of the present invention, there is provided a turbo packet demultiplexing apparatus that receives a turbo packet in a digital broadcasting system, the turbo packet demultiplexing apparatus including: a turbo extractor to extract turbo data; a condenser to extract a data area from the extracted turbo data; a deinterleaver to deinterleave the extracted data area; and an RS decoder to RS-decode the deinterleaved data area.

According to another aspect of the present invention, the deinterleaver may adjust a memory size thereof according to a data transmission rate.

According to another aspect of the present invention, the deinterleaver may be a convolutional deinterleaver.

According to another aspect of the present invention, there is provided a method of demultiplexing a turbo packet in a digital broadcasting system, the method including: extracting turbo data; extracting a data area from the extracted turbo data; deinterleaving the extracted data area; and RS-decoding the deinterleaved data area.

According to another aspect of the present invention, the deinterleaving may adjust a memory size of a deinterleaver performing the deinterleaving according to a data transmission rate.

According to another aspect of the present invention, the deinterleaving may use a convolutional deinterleaver.

According to another aspect of the present invention, there is provided a transport stream generating apparatus that processes turbo data to generate a transmission stream to be transmitted in a digital broadcasting system, the transport stream generating apparatus including: an interleaver to interleave the RS-encoded turbo data.

According to another aspect of the present invention, there is provided a turbo packet demultiplexing apparatus that receives and processes a turbo packet in a digital broadcasting system, the turbo packet demultiplexing apparatus including: a deinterleaver to deinterleave the extracted data area.

According to another aspect of the present invention, there is provided a digital broadcasting system including: a transport stream generating apparatus to generate a transport stream, the transport stream generating apparatus including: a Reed Solomon (RS) encoder to RS-encode turbo data, an interleaver to interleave the RS-encoded turbo data, a duplicator to add a parity insertion area to the interleaved turbo data, and a multiplexer to multiplex normal data and the turbo data processed by the duplicator to generate the transport stream; and a turbo packet demultiplexing apparatus to receive the transport stream and to process the turbo data in the transport stream, the turbo packet demultiplexing apparatus including: a turbo extractor to extract the turbo data from the received transport stream, a condenser to extract a data area from the extracted turbo data, a deinterleaver to deinterleave the extracted data area, and an RS decoder to RS-decode the deinterleaved data area.

According to another aspect of the present invention, there is provided a method of transmitting turbo data in a digital broadcasting system, the method including: Reed Solomon (RS)-encoding the turbo data; interleaving the RS-encoded turbo data; adding a parity insertion area to the interleaved turbo data; multiplexing normal data and the turbo data to which the parity insertion area is added to generate a transport stream and transmitting the transport stream; receiving the transport stream and extracting the turbo data therefrom; extracting a data area from the extracted turbo data; deinterleaving the extracted data area; and RS-decoding the deinterleaved data area.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
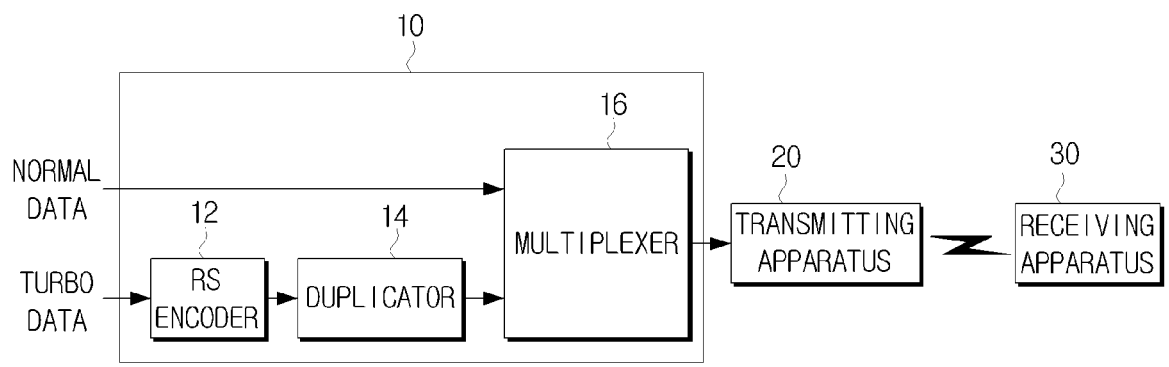
FIG. 1 is a block diagram illustrating a conventional digital broadcasting system according to the ATSC VSB standard.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
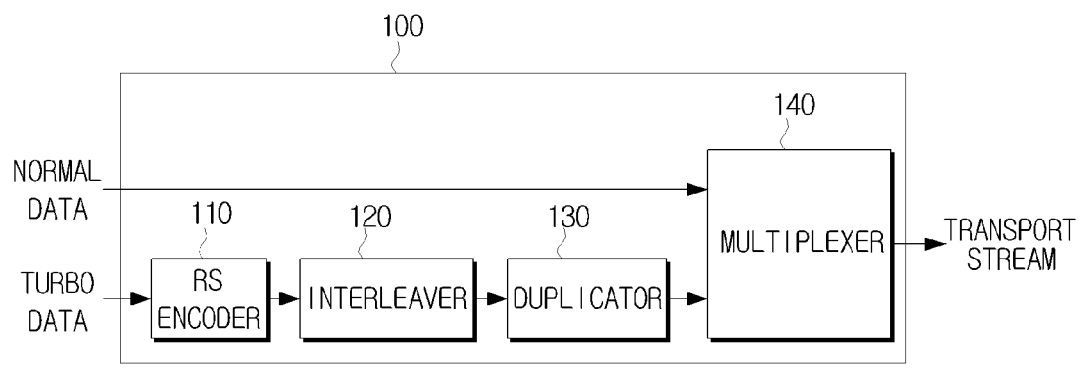
FIG. 2 is a block diagram illustrating a transport stream generating apparatus according to an embodiment of the present invention.

FIG. 2 is a block diagram illustrating a transport stream generating apparatus 100 according to an embodiment of the present invention. Referring to FIG. 2, the transport stream generating apparatus 100 includes a Reed Solomon (RS) encoder 110, an interleaver 120, a duplicator 130, and a multiplexer 140.

The RS encoder 110 RS encodes received turbo data. Specifically, the RS encoding calculates parity for the turbo data, and adds the parity to the turbo data. The RS encoding may encode the turbo data with the exception of a synchronization signal of the turbo data. The interleaver 120 interleaves the RS-encoded turbo data. The interleaver 120 adjusts a memory size according to a data rate, which will be described in detail below with reference to FIG. 3.

The duplicator 130 adds a parity insertion area to the turbo data interleaved by the interleaver 120. The duplicator 130 converts each byte of a turbo stream according to a pre-set coding rate, thereby preparing a parity insertion area between data bits within the turbo stream. The multiplexer 140 multiplexes normal data and the turbo data processed by the duplicator 130, thereby generating a transport stream. The transport stream is then transmitted to a transmitting apparatus (not shown), which will be described below. The generated transport stream may be a dual transport stream, or a multi transport stream.

Figure 3:
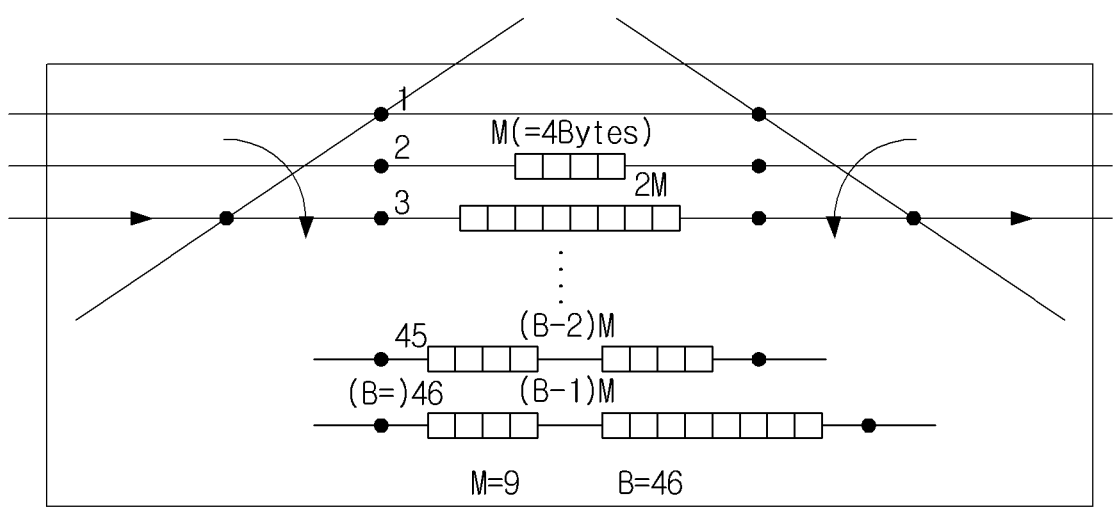
FIG. 3 is a view illustrating the interleaver of FIG. 2.

FIG. 3 is a view illustrating the interleaver 120 of FIG. 2. In general, 188 byte packets are used as an input to the transport stream generating apparatus 100 in the advanced vestigial sideband (AVSB) system. However, it is understood that aspects of the present invention are not limited thereto. For example, 187 byte packets not including a synchronization signal byte may be used as an input to the transport stream generating apparatus 100. N number of RS-encoded packets (where N is an integer) are inserted into one field, and accordingly, if a (207,187) RS encoding is performed for the 187 byte packets, bytes corresponding to N times 207(9*23) bytes are inserted into one field. Also, the RS-encoded 207 byte packet starts from a position of the field. In order to perform an RS decoding after deinterleaving, a receiving side determines the start position of the RS-encoded 207 byte packet. For this, the RS-encoded packet may start from the start position of the field.

In the AVSB system, the RS-encoded packet starts from the start position of the field and the N number of packets are inserted in one field (N being an integer). Accordingly, if the delay of the interleaver 120 is set to be N times the length of the RS-encoded 207 byte packet, the receiving side can perform an RS decoding from the start position of the field.

The interleaver 120 provided in the transport stream generating apparatus 100 adjusts a memory size according to a data rate. Any type of interleaver can be used for the interleaver 120. For example, an interleaver having a long interleaving depth (such as a convolutional interleaver) for the purpose of improving reception performance even under fading conditions may be used. FIG. 3 illustrates a structure of the convolutional interleaver.

The delay of the convolutional interleaver after interleaving and deinterleaving is expressed by the following Equation 1:

$$D=B*(B-1)*M, \quad \text{Equation 1}$$

where D denotes a delay, B denotes a number of branches, and M denotes a memory size.

If the delay D obtained by Equation 1 is set to be N times the length of the packet when the convolutional interleaver is designed, the receiving side can accurately know where an RS decoding is to be performed. As the number of branches B increases, performance improves, though it is difficult to reach a maximum delay D. Accordingly, the number of branches B and the memory size M can be appropriately adjusted. For example, the convolutional interleaver of FIG. 3 has a number of branches (B) equal to 46, and a memory size (M) equal to 9. Also, in designing the convolutional interleaver, the number of branches B is set to have a value by which a transmission data unit is dividable. The transmission data unit is a unit of normal data of VSB, and 52 segments or 1 field may be selected as a transmission data unit.

Additional coding or interleaving processes may be performed according to a transmission data unit. For example, if (207,187) RS-encoded 207 byte packet data is to be processed in the unit of one field and transmitted at 1.5 Mpbs, 24 packets can be transmitted per one field. The total number of bytes of 24 packets is 24×207 bytes, and this value can be divided by the number of branches B. Accordingly, a transmitting side and a receiving side can start the convolutional interleaving and the convolutional deinterleaving from a branch corresponding to a start position of the transmitted data.

The data passing through the convolutional interleaver in the transmission data unit may contain an integer number of packets that has undergone an additional encoding (such as an RS coding). In this case, if the convolutional interleaver starts from an uppermost position at a start position of the transmission data unit, the interleaver ends with the last branch at an ending position of the transmission data unit. That is, the start position of every transmission data unit is connected to the uppermost position of the convolutional interleaver. If the number of branches B is set to be a value by which the length of the packets is divisible, the data can be received. Also, if the start position of the transmission data unit is connected to the uppermost position of the convolutional interleaver having a large memory capacity, the data can be more easily received.

As described above, if the delay D is set to be N times the packet length, the receiving side can accurately know the location of the RS decoding. For example, if the number of branches is 46 (B=46) and the memory size is 9 (M=9) as shown in FIG. 3, a delay D corresponding to N times the packet length is set in the receiving side after RS-deinterleaving. In this example, since the delay is N times the packet length when the receiver performs the deinterleaving, the branch is connected to the same position as the start position of the transmission data unit, and the RS decoding is additionally performed with respect to the output signal from the start position according to the length of the received packets.

The AVSB system may support 375 Kbps, 500 Kbps, 750 Kbps, 1 Mbps, 1.5 Mbps as a turbo data transmission mode in view of a data rate. However, it is understood that the transmission data rate mode is not limited to the above and may be variable. The number of packets per one field in the above-mentioned modes is 6, 8, 12, 16, and 24, respectively. In order to make delays caused by the interleaving in all modes equal, memory sizes may differ according to the transmission data sizes in the respective modes. For example, if the number of branches is 46 and the respective memory sizes are 9*3, 9*4, 9*6, 9*8, 9*12 (which are proportional values to the transmission rates), and if the delay is divided by the number of bytes (207*6, 207*8, 207*12, 207*16, 207*24) existing in one field, a delay having the same size as the 45 fields (i.e., B−1 or 46−1) is generated.

The delays may be made to be equal in order to maintain a constant reception performance in several modes. As the delay values of the interleaver 120 are made equal, it is possible to set the delay value to be N times the 207 bytes of the RS-encoded packet and also to reach a desired value. In this case, the receiving side performs an RS decoding from the start position of the field, thereby obtaining turbo data.

If the interleaver 120 is designed to interleave (208,188) RS-encoded 188 byte packet data, the memory size M is adjusted according to a data rate in order to make the delays of the data modes equal and/or the number of branches is set to be 52 in order to connect a start position and an end position of the transmission unit to the first branch and the last branch.

Figure 4:
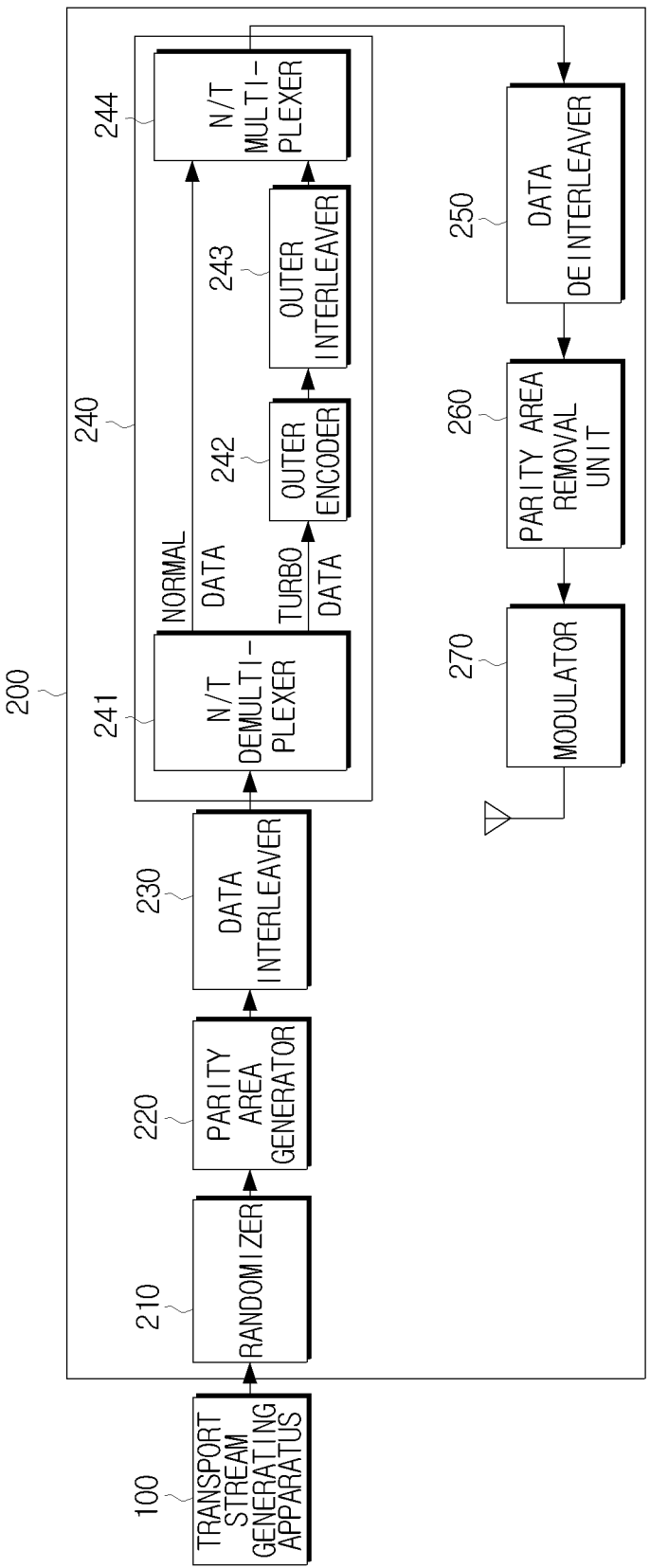
FIG. 4 is a block diagram illustrating a transmitting apparatus according to an embodiment of the present invention.

FIG. 4 is a block diagram illustrating a transmitting apparatus 200 according to an embodiment of the present invention. Referring to FIG. 4, the transmitting apparatus 200 includes a randomizer 210, a parity area generator 220, a data interleaver 230, a turbo processor 240, a data deinterleaver 250, a parity area removal unit 260, and a modulator 270. As described above, the transmitting apparatus 200 receives the transport stream from the transport stream generating apparatus 100.

The randomizer 210 randomizes the transport stream received from the transport stream generating apparatus 100. The parity area generator 220 adds a parity area to the randomized transport stream. The data interleaver 230 interleaves the transport stream having the parity area added thereto. The turbo processor 240 detects turbo data from the interleaved transport stream and robustly processes the detected turbo data. The shown turbo processor 240 includes an N/T demultiplexer 241, an outer encoder 242, an outer interleaver 243, and an N/T multiplexer 244. The N/T demultiplexer 241 divides the interleaved transport stream into normal data and turbo data. The N/T demultiplexer 241 then transmits the turbo data to the outer encoder 242 and the normal data to the N/T multiplexer 244. That is, the N/T demultiplexer 241 transmits the transport stream from which the turbo data is separated to the N/T multiplexer 244. The outer encoder 242 encodes the turbo data divided by the N/T demultiplexer 241. The outer interleaver 243 interleaves the encoded turbo data. The N/T multiplexer 244 inserts the turbo data that has been processed by the outer encoder 242 and the outer interleaver 243 into the transport stream from which the turbo data was separated, thereby remaking a transport stream in which only the turbo data is robustly processed.

The data deinterleaver 250 deinterleaves the transport stream that is output from the turbo processor 240. The parity area removal unit 260 removes the parity area from the deinterleaved transport stream. The modulator 270 channel-modulates the transport stream, up-converts the transport stream to an RF channel band signal, and transmits the up-converted transport stream. The transmitted transport stream may then be received by a receiving apparatus (not shown) through a channel.

It is understood that all aspects of the present invention are not limited to the above construction of the transmitting apparatus 200. For example, according to other aspects, the transmitting apparatus 200 may not include the randomizer 210, the parity area generator 220 and the parity area removal unit 260, and/or the data interleaver 230 and the data deinterleaver 25 depending on circumstances. That is, the transmitting apparatus 200 shown in FIG. 4 is merely an example of an apparatus for transmitting the transport stream generated by the transport stream generating apparatus 100 according to an embodiment of the present invention, and is not limited to the structure as described above. It will be apparent to an ordinarily skilled person in the art that various types of transmitting apparatuses can be applicable.

Figure 5:
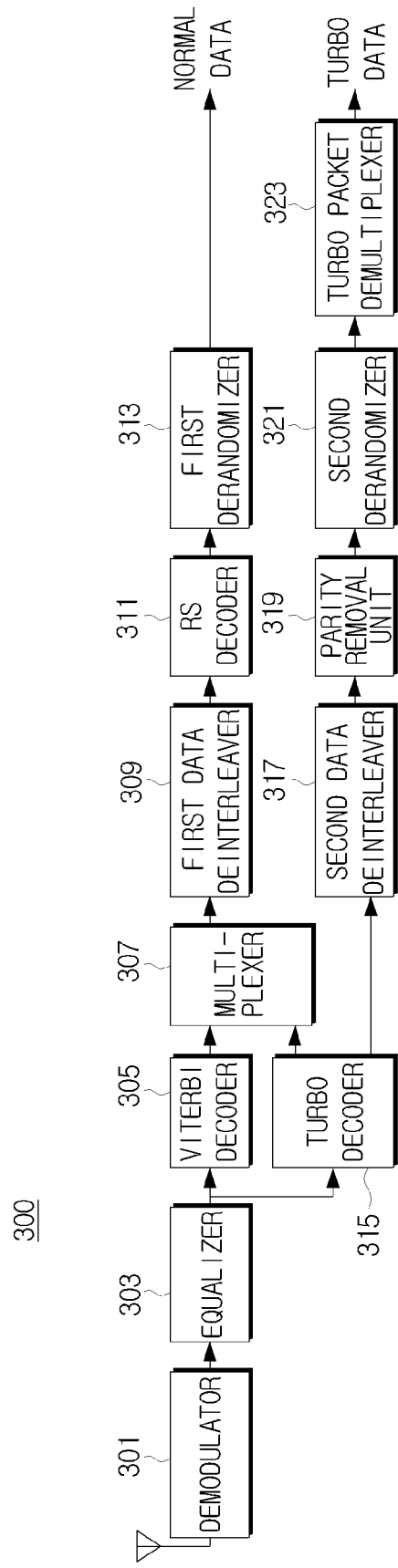
FIG. 5 is a block diagram illustrating a receiving apparatus according to an embodiment of the present invention.

FIG. 5 is a block diagram illustrating a receiving apparatus 300 according to an embodiment of the present invention. Referring to FIG. 5, the receiving apparatus 300 includes a demodulator 301, an equalizer 303, a Viterbi decoder 305, a multiplexer 307, a first data deinterleaver 309, an RS decoder 311, a first derandomizer 313, a turbo decoder 315, a second data deinterleaver 317, a parity removal unit 319, a second derandomizer 321, and a turbo packet demultiplexer 323.

If a transport stream that has been modulated in the form of an RF signal is received through a channel, the demodulator 301 detects a synchronization signal from a baseband signal of the received transport stream, and demodulates the transport stream. The equalizer 303 equalizes the demodulated transport stream. Accordingly, it is possible to compensate for channel distortion that is caused by a multipath of the channel. The Viterbi decoder 305 performs an error correction with respect to normal data of the equalized transport stream and decodes an error-corrected symbol, thereby outputting a symbol packet. The multiplexer 307 serves as a switch for the normal data received from the Viterbi decoder 305 or the turbo decoder 315. The first data deinterleaver 309 deinterleaves the normal data. The RS decoder 311 RS decodes the deinterleaved normal data. The first derandomizer 313 derandomizes the RS-decoded normal data.

The turbo decoder 315 turbo decodes the turbo data from the transport stream. The second data deinterleaver 317 deinterleaves the turbo-decoded turbo data. The parity removal unit 319 removes parity from the deinterleaved turbo data. The second derandomizer 321 derandomizes the turbo data from which the parity is removed. The turbo packet demultiplexer 323 processes the derandomized turbo data, which will be described below with reference to FIG. 6.

It is understood that all aspects of the present invention are not limited to the above construction of the transmitting apparatus 200. For example, according to other aspects, the receiving apparatus 300 may not include the second data deinterleaver 317, the parity removal unit 319, and/or the second derandomizer 321 depending on circumstances. That is, the receiving apparatus 300 of FIG. 5 is merely an example of a receiver corresponding to the transmitting apparatus 200 of FIG. 4, and is not limited to the structure as described above.

As described above, modifications and variations can be applied to the transmitting apparatus 200 and, accordingly, the receiving apparatus 300 can be modified and varied.

Figure 6:
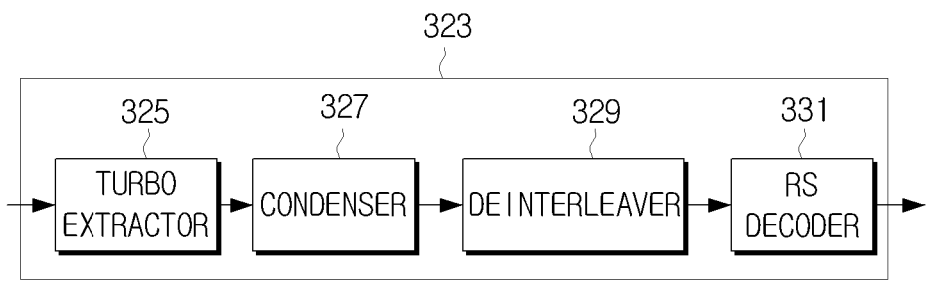
FIG. 6 is a block diagram illustrating a turbo packet demultiplexing apparatus according to an embodiment of the present invention.

FIG. 6 is a block diagram illustrating a turbo packet demultiplexing apparatus 323 according to an embodiment of the present invention. Referring to FIG. 6, the turbo packet demultiplexing apparatus 323 includes a turbo extractor 325, a condenser 327, a deinterleaver 329, and an RS decoder 311. The turbo extractor 325 extracts turbo data from a transport stream. However, if turbo data is directly input into the turbo packet demultiplexing apparatus 323, the turbo extractor 325 may not be operated. The condenser 327 extracts a data area not including a parity area from the turbo data extracted by the turbo extractor 325. However, if the data area is input directly without the parity, the condenser 327 may not be operated. The deinterleaver 329 deinterleaves the data area extracted by the condenser 327. The deinterleaver 329 of the turbo packet demultiplexing apparatus 323 corresponds to the interleaver 120 of the transport stream generating apparatus 100 of FIG. 2. Like the interleaver 120, the deinterleaver 329 adjusts a memory size according to a data rate. If the interleaver 120 of the transport stream generating apparatus 100 is a convolutional interleaver, the deinterleaver 329 employs a convolutional deinterleaver. The convolutional deinterleaver may be designed to be connected in a reverse way to the convolution interleaver. The RS decoder 311 RS decodes to the data area of the deinterleaved turbo data.

Figure 7:
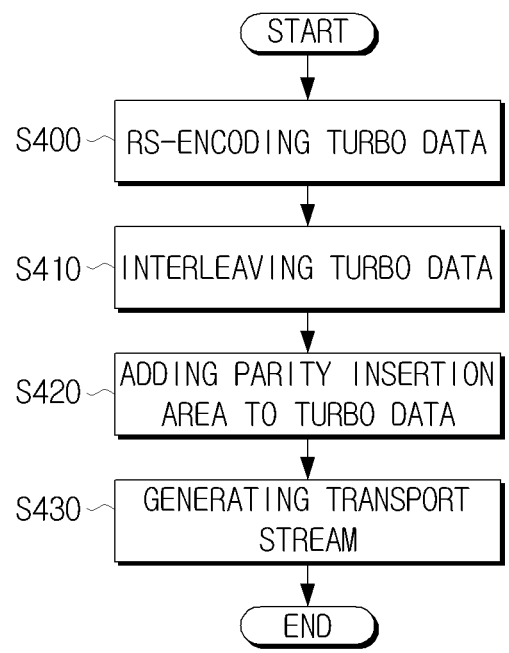
FIG. 7 is a flowchart illustrating a method of generating a transport stream according to an embodiment of the present invention.

FIG. 7 is a flowchart illustrating a method of generating a transport stream according to an embodiment of the present invention. Referring to FIG. 7, the turbo data is RS encoded in operation S400, and the RS-encoded turbo data is interleaved in operation S410. A convolutional interleaver may interleave the RS-encoded turbo data.

A parity insertion area is added to the interleaved turbo data in operation S420, and normal data and the turbo data are multiplexed to generate a transport steam in operation S430. The transport stream generated in operations S400 through S430 is transmitted to the transmitting apparatus 200.

Figure 8:
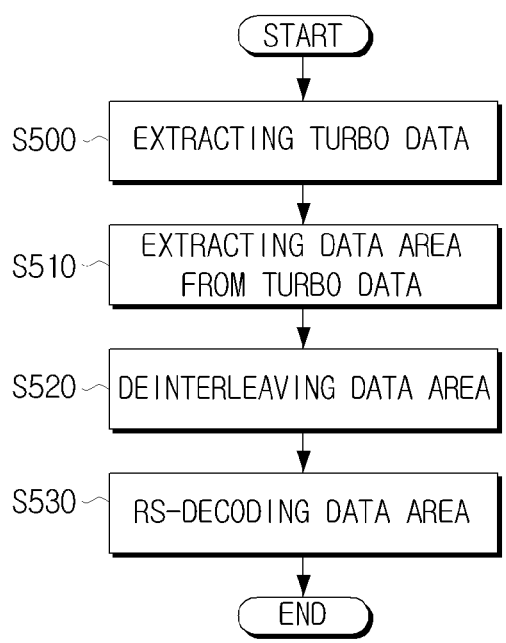
FIG. 8 is a flowchart illustrating a method of demultiplexing a turbo packet according to an embodiment of the present invention.

FIG. 8 is a flowchart illustrating a method of demultiplexing a turbo packet according to an embodiment of the present invention. Referring to FIG. 8, turbo data is extracted from a transport stream in operation S500. According to other aspects, the turbo data is directly input such that the method does not include an extracting operation.

A data area is extracted from the turbo data in operation S510, and the extracted data area is deinterleaved in operation S520. A convolutional deinterleaver may deinterleave the extracted data area. The deinterleaved turbo data is RS decoded and output in operation S530.

As described above, a transport stream generating apparatus 100 according to aspects of the present invention performs an interleaving process (for example, using a convolutional interleaver) to generate a transport stream, and the transport stream is transmitted to a receiving apparatus 300 through a transmitting apparatus 200. The receiving apparatus 300 performs a deinterleaving process (for example, using a convolutional deinterleaver) to recover an original broadcast signal from the received transport stream. Accordingly, reception performance in the AVSB system can be improved. The transport stream generating apparatus, the turbo packet demultiplexing apparatus, and methods thereof may use an interleaver of a large size suitable for an AVSB system, thereby improving a reception performance in the AVSB system.

While not required in all aspects, aspects of the present invention can be implemented using software encoded on one or more computer-readable media for use with one or more computers and/or processors.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A transport stream generating apparatus for a digital broadcasting system, the transport stream generating apparatus comprising:
   a Reed Solomon (RS) encoder to RS-encode robust data;
   an interleaver to interleave the RS-encoded robust data;
   a duplicator to add a parity insertion area to the interleaved robust data; and
   a multiplexer to multiplex normal data and the robust data processed by the duplicator to generate a transport stream,
   wherein at least one of the RS encoder, the interleaver, the duplicator, and the multiplexer is implemented as a hardware component.

2. The transport stream generating apparatus as claimed in claim 1, wherein the interleaver adjusts a memory size thereof according to a data transmission rate.

3. The transport stream generating apparatus as claimed in claim 1, wherein the interleaver is a convolutional interleaver.

4. The transport stream generating apparatus as claimed in claim 3, wherein a number of branches of the convolutional interleaver is set to be a proper divisor of a transmission data unit of the digital broadcasting system.

5. The transport stream generating apparatus as claimed in claim 3, wherein the interleaver sets a number of branches and a memory size of the interleaver to satisfy:

$$B*(B-1)*M = N*\text{a packet length},$$

where B is the number of branches, M is the memory size, and N is an integer.

6. The transport stream generating apparatus as claimed in claim 5, wherein a delay of the interleaver is set to satisfy:

$$D = N*\text{the packet length},$$

where D is the delay from a start position of a packet to a position in the packet at which RS encoding has begun.

7. The transport stream generating apparatus as claimed in claim 1, wherein the digital broadcasting system complies with a vestigial sideband (VSB) standard.

8. A method of generating a transport stream in a digital broadcasting system, the method comprising:
   Reed Solomon (RS)-encoding robust data;
   interleaving the RS-encoded robust data;
   adding a parity insertion area to the interleaved robust data; and
   multiplexing normal data and the robust data that has the parity insertion area added thereto to generate a transport stream.

9. The method as claimed in claim 8, wherein the interleaving comprises adjusting a memory size of an interleaver that performs the interleaving according to a data transmission rate.

10. The method as claimed in claim 8, wherein the interleaving comprises performing the interleaving with a convolutional interleaver.

11. The method as claimed in claim 10, wherein a number of branches of the convolutional interleaver is set to be a proper divisor of a transmission data unit of the digital broadcasting system.

12. The method as claimed in claim 10, wherein the interleaving comprises setting a number of branches of the convolutional interleaver and a memory size of the convolutional interleaver to satisfy:

$$B*(B-1)*M = N*\text{a packet length},$$

where B is the number of branches, M is the memory size, and N is an integer.

13. The method as claimed in claim 12, wherein the interleaving comprises setting a delay of the convolutional interleaver to satisfy:

$$D = N*\text{the packet length},$$

where D is the delay from a start position of a packet to a position in the packet at which RS encoding has begun.

14. The method as claimed in claim 8, wherein the digital broadcasting system complies with a vestigial sideband (VSB) standard.

15. A turbo packet demultiplexing apparatus that receives a turbo packet in a digital broadcasting system, the turbo packet demultiplexing apparatus comprising:
   a condenser to extract a data area from robust data received in the turbo packet;
   a deinterleaver to deinterleave the extracted data area; and
   a Reed Solomon (RS) decoder to RS-decode the deinterleaved data area,
   wherein at least one of the condenser, the deinterleaver, and the RS decoder is implemented as a hardware component.

16. The turbo packet demultiplexing apparatus as claimed in claim 15, further comprising a turbo extractor to extract the robust data from a received transport stream.

17. The turbo packet demultiplexing apparatus as claimed in claim 15, wherein the deinterleaver adjusts a memory size of the deinterleaver according to a data transmission rate.

18. The turbo packet demultiplexing apparatus as claimed in claim 15, wherein the deinterleaver is a convolutional deinterleaver.

19. The turbo packet demultiplexing apparatus as claimed in claim 15, wherein the digital broadcasting system complies with a vestigial sideband (VSB) standard.

20. A method of demultiplexing a turbo packet in a turbo packet received in a digital broadcasting system, the method comprising:
   extracting a data area from robust data received in the turbo packet;
   deinterleaving the extracted data area; and
   Reed Solomon (RS)-decoding the deinterleaved data area.

21. The method as claimed in claim 20, further comprising extracting the robust data from a received transport stream.

22. The method as claimed in claim 20, wherein the deinterleaving comprises adjusting a memory size of a deinterleaver that performs the deinterleaving according to a data transmission rate.

23. The method as claimed in claim 20, wherein the deinterleaving comprises performing the deinterleaving with a convolutional deinterleaver.

24. The method as claimed in claim 20, wherein the digital broadcasting system complies with a vestigial sideband (VSB) standard.

25. A transport stream generating apparatus that processes RS-encoded robust data and normal data to generate a transmission stream to be transmitted in a digital broadcasting system, the transport stream generating apparatus comprising:
   an interleaver to interleave the RS-encoded turbo data prior to parity being added to the RS-encoded robust data, wherein the interleaver is implemented as a hardware component.

26. The transport stream generating apparatus as claimed in claim 25, wherein the interleaver sets a number of branches and a memory size of the interleaver to satisfy:

$$B*(B-1)*M=N*\text{a packet length},$$

where B is the number of branches, M is the memory size, and N is an integer.

27. A turbo packet demultiplexing apparatus that receives and processes a turbo packet in a digital broadcasting system, the turbo packet demultiplexing apparatus comprising:
a deinterleaver to deinterleave a data area of robust data in the turbo packet prior to RS-decoding the data area,
wherein the deinterleaver adjusts a memory size of the deinterleaver according to a data transmission rate, and
wherein the deinterleaver is implemented as a hardware component.

28. A digital broadcasting system comprising:
a transport stream generating apparatus to generate a transport stream, the transport stream generating apparatus comprising:
a Reed Solomon (RS) encoder to RS-encode robust data,
an interleaver to interleave the RS-encoded robust data,
a duplicator to add a parity insertion area to the interleaved robust data, and
a multiplexer to multiplex normal data and the robust data processed by the duplicator to generate the transport stream; and
a turbo packet demultiplexing apparatus to receive the transport stream and to process the robust data in the transport stream, the turbo packet demultiplexing apparatus comprising:
a turbo extractor to extract the robust data from the received transport stream, a condenser to extract a data area from the extracted robust data,
a deinterleaver to deinterleave the extracted data area, and
an RS decoder to RS-decode the deinterleaved data area,
wherein at least one of the transport stream generating apparatus and the turbo packet demultiplexing apparatus includes a hardware component.

29. The digital broadcasting system as claimed in claim 28, wherein: the interleaver is a convolutional interleaver; and
the deinterleaver is a convolutional deinterleaver.

30. A method of transmitting turbo data in a digital broadcasting system, the method comprising:
Reed Solomon (RS)-encoding the robust data;
interleaving the RS-encoded robust data;
adding a parity insertion area to the interleaved robust data;
multiplexing normal data and the robust data to which the parity insertion area is added to generate a transport stream and transmitting the transport stream;
receiving the transport stream and extracting the robust data therefrom;
extracting a data area from the extracted robust data;
deinterleaving the extracted data area; and
RS-decoding the deinterleaved data area.

31. The method as claimed in claim 30, wherein:
the interleaving of the RS-encoded robust data comprises performing the interleaving with a convolutional interleaver; and
the deinterleaving of the extracted data area comprises performing the deinterleaving with a convolutional deinterleaver.

32. A broadcast receiving apparatus comprising:
a demodulator to receive a transport stream generated from a transport stream generating apparatus and demodulate the transport stream; and
an equalizer to equalize the demodulated stream,
wherein the transport stream generating apparatus comprising:
a Reed Solomon (RS) encoder to RS-encode robust data;
an interleaver to interleave the RS-encoded robust data;
a duplicator to add a parity insertion area to the interleaved robust data; and
a multiplexer to multiplex normal data and the robust data processed by the duplicator to generate a transport stream,
wherein at least one of the demodulator and the equalizer is implemented as a hardware component.

* * * * *